US012776354B2

(12) United States Patent
Magee et al.

(10) Patent No.: US 12,776,354 B2
(45) Date of Patent: Oct. 27, 2026

(54) SOURCE SYNCHRONOUS PARTITION OF AN SDRAM CONTROLLER SUBSYSTEM

(71) Applicant: Altera Corporation, San Jose, CA (US)

(72) Inventors: Terence Magee, San Francisco, CA (US); Jeffrey Schulz, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 18/085,528

(22) Filed: Dec. 20, 2022

(65) Prior Publication Data

US 2023/0123826 A1 Apr. 20, 2023

(51) Int. Cl.

| | |
|---|---|
| *G11C 16/04* | (2006.01) |
| *G11C 7/10* | (2006.01) |
| *G11C 7/22* | (2006.01) |

(52) U.S. Cl.

CPC ............ *G11C 7/222* (2013.01); *G11C 7/1066* (2013.01); *G11C 7/1069* (2013.01)

(58) Field of Classification Search

CPC ...... G11C 7/222; G11C 7/1066; G11C 7/1069

See application file for complete search history.

(56) References Cited

U.S. PATENT DOCUMENTS

| | | | | |
|---|---|---|---|---|
| 6,226,338 | B1 * | 5/2001 | Earnest | G06F 5/065 375/372 |
| 10,423,386 | B1 * | 9/2019 | Chung | G11C 8/18 |
| 10,833,679 | B2 | 11/2020 | Clark et al. | |
| 2014/0006730 | A1 * | 1/2014 | Zain | G06F 13/1673 711/155 |
| 2016/0049941 | A1 | 2/2016 | How et al. | |
| 2016/0329085 | A1 * | 11/2016 | Yu | G11C 7/222 |

* cited by examiner

*Primary Examiner* — Pho M Luu

(74) *Attorney, Agent, or Firm* — Fletcher Yoder, P.C.

(57) ABSTRACT

Systems or methods may provide a programmable logic fabric and a memory controller communicatively coupled to the programmable logic fabric. The systems or methods also include a physical layer and IO circuit coupled to the programmable logic fabric via the memory controller and a FIFO to receive read data from a memory device coupled to the physical layer and IO circuit. Furthermore, the FIFO is closer to the memory controller than to the physical layer and IO circuit.

20 Claims, 8 Drawing Sheets

SOURCE SYNCHRONOUS PARTITION OF AN SDRAM CONTROLLER SUBSYSTEM

BACKGROUND

The present disclosure relates generally to communication for semiconductor devices. More particularly, the present disclosure relates communication between electrical components providing an input or output for programmable logic devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuits, such as field programmable gate arrays (FPGAs) are programmed to perform one or more particular functions. A memory controller of the FPGA may face challenges with timing when driving input output (IO) banks due to the size of the memory controller and mismatches in distance from memory controller and its respective IOs. As technology progresses and memory controllers reduce their area, the overall size of IOs skew between paths to different IOs varies due to the different distances to different IOs. The memory controller may be system synchronous in its communication to the IOs (and/or their physical connections) using a common clock that may exacerbate the skew issue impacting device performance.

Additionally, the monolithic die of an FPGA may be disaggregated into a main die and multiple smaller dies, often called chiplets or tiles to improve yield and costs of complex systems. However, disaggregation of a controller in a synchronous dynamic random accessible memory (SDRAM) memory subsystem and IOs to separate chiplets on cheaper technology nodes may cause the controller to incur higher power, performance, and area (PPA) costs.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
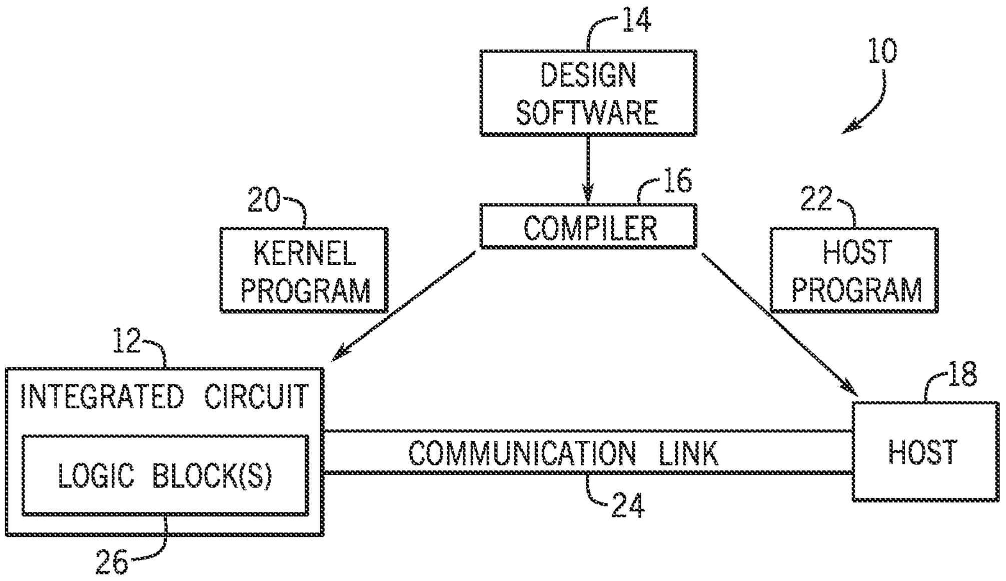
FIG. 1 is a block diagram of a system used to program an integrated circuit device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As previously noted, the system synchronous communications memory controller may incur a skew in signals and latency in communication as a result of differing distances between the memory controller and the IOs. Moreover, the movement of the entire SDRAM memory subsystem and IOs to an older technology node using disaggregation may negatively impact PPA scaling of a memory controller and increase latency of communication to and from the DRAM. The memory controller may contain levels of unstructured logic such as arbiters, deep scheduling queues, and protocol controls that may benefit from performance scaling of more advanced nodes implementing the core circuitry. In other words, if the memory controller is moved to the older technology nodes using disaggregation may affect power, performance, and cause latency in communication from the memory controller.

With this in mind, the present systems and techniques relate to embodiments for changing the system synchronous memory controller to an independent source synchronous memory controller including transmit and receive channels with independent clocks. Additionally, the present systems and techniques relate to changing the die-to-die cut point in disaggregation such that the controller stays on the main FPGA die and communicates in a source synchronous manner to core logic. Further, the physical layer and IOs may move to older technology nodes or chiplets and communicate with the controller in a source synchronous manner to allow the controller to communicate more easily over distances. The die-to-die cut point between the controller and the physical layer may allow for communication through existing re-alignment circuitry to re-align the signal to the controller clock 118 and data, thus reducing latency.

With the foregoing in mind, FIG. 1 illustrates a block diagram of a system 10 that may implement arithmetic operations. A designer may desire to implement functionality, such as the operations of this disclosure, on an integrated circuit device 12 (e.g., a programmable logic device, such as a field programmable gate array (FPGA) or an application specific integrated circuit (ASIC)). In some cases, the designer may specify a high-level program to be implemented, such as an OPENCL® program, which may enable the designer to more efficiently and easily provide programming instructions to configure a set of programmable logic cells for the integrated circuit device 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designer may implement high-level designs using design software 14, such as a version of INTEL® QUARTUS® by INTEL CORPORATION. The design software 14 may use a compiler 16 to convert the high-level program into a lower-level description. In some embodiments, the compiler 16 and the design software 14 may be packaged into a single software application. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit device 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
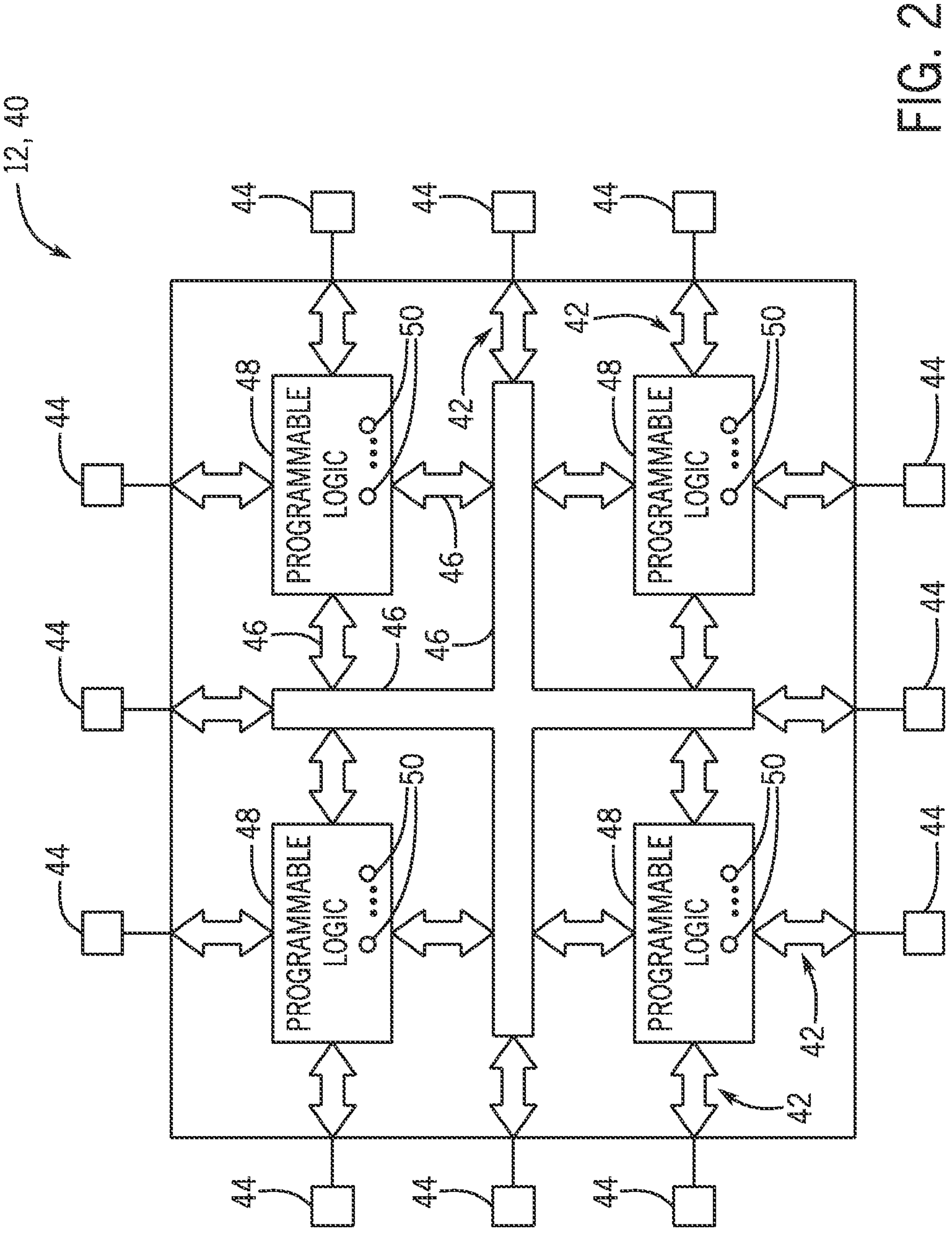
FIG. 2 is a block diagram of the integrated circuit device of FIG. 1, in accordance with an embodiment of the present disclosure.

Turning now to a more detailed discussion of the integrated circuit device 12, FIG. 2 is a block diagram of an example of the integrated circuit device 12 as a programmable logic device, such as a field-programmable gate array (FPGA). Further, it should be understood that the integrated circuit device 12 may be any other suitable type of programmable logic device (e.g., an ASIC and/or application-specific standard product). The integrated circuit device 12 may have input/output (IO) circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit device 12, may include programmable elements 50 with the programmable logic 48. In some embodiments, at least some of the programmable elements 50 may be grouped into logic array blocks (LABs). As discussed above, a designer (e.g., a customer) may (re) program (e.g., (re) configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology as described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
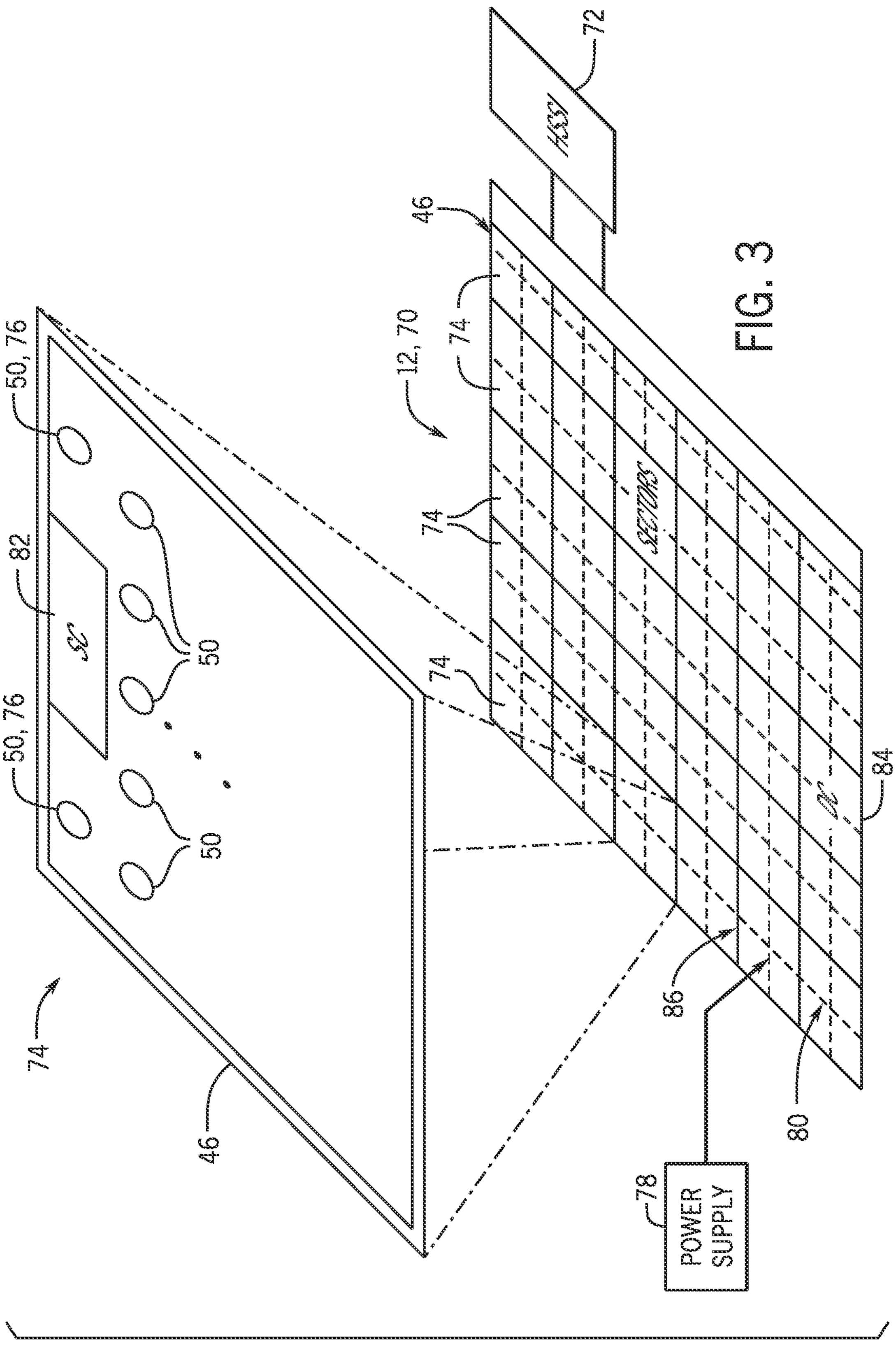
FIG. 3 is a diagram of programmable fabric of the integrated circuit device of FIG. 1, in accordance with an embodiment of the present disclosure.

The integrated circuit device 12 may include any programmable logic device such as a field programmable gate array (FPGA) 70, as shown in FIG. 3. For the purposes of this example, the FPGA 70 is referred to as an FPGA, though it should be understood that the device may be any suitable type of programmable logic device (e.g., an application-specific integrated circuit and/r application-specific standard product). In one example, the FPGA 70 is a sectorized FPGA of the type described in U.S. Patent Publication No. 2016/0049941, "Programmable Circuit Having Multiple Sectors," which is incorporated by reference in its entirety for all purposes. The FPGA 70 may be formed on a single plane. Additionally or alternatively, the FPGA 70 may be a three-dimensional FPGA having a base die and a fabric die of the type described in U.S. Pat. No. 10,833,679, "Multi-Purpose Interface for Configuration Data and User Fabric Data," which is incorporated by reference in its entirety for all purposes.

In the example of FIG. 3, the FPGA 70 may include transceiver 72 that may include and/or use input/output circuitry, such as input/output circuitry 42 in FIG. 2, for driving signals off the FPGA 70 and for receiving signals from other devices. Interconnection resources 46 may be used to route signals, such as clock or data signals, through the FPGA 70. The FPGA 70 is sectorized, meaning that programmable logic resources may be distributed through a number of discrete programmable logic sectors 74. Programmable logic sectors 74 may include a number of programmable elements 50 having operations defined by configuration memory 76 (e.g., CRAM). A power supply 78 may provide a source of voltage (e.g., supply voltage) and current to a power distribution network (PDN) 80 that distributes electrical power to the various components of the FPGA 70. Operating the circuitry of the FPGA 70 causes power to be drawn from the power distribution network 80.

There may be any suitable number of programmable logic sectors 74 on the FPGA 70. Indeed, while 29 programmable logic sectors 74 are shown here, it should be appreciated that more or fewer may appear in an actual implementation (e.g., in some cases, on the order of 50, 100, 500, 1000, 5000, 10,000, 50,000 or 100,000 sectors or more). Programmable logic sectors 74 may include a sector controller (SC) 82 that controls operation of the programmable logic sector 74. Sector controllers 82 may be in communication with a device controller (DC) 84.

Sector controllers 82 may accept commands and data from the device controller 84 and may read data from and write data into its configuration memory 76 based on control signals from the device controller 84. In addition to these operations, the sector controller 82 may be augmented with numerous additional capabilities. For example, such capabilities may include locally sequencing reads and writes to implement error detection and correction on the configuration memory 76 and sequencing test control signals to effect various test modes.

The sector controllers 82 and the device controller 84 may be implemented as state machines and/or processors. For example, operations of the sector controllers 82 or the device controller 84 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow routines to have multiple variants depending on "modes" the local controller may be placed into. When the control program memory is implemented as RAM, the RAM may be written with new routines to implement new operations and functionality into the programmable logic sectors 74. This may provide usable extensibility in an efficient and easily understood way. This may be useful because new commands could bring about large amounts of local activity within the sector at the expense of only a small amount of communication between the device controller 84 and the sector controllers 82.

Sector controllers 82 thus may communicate with the device controller 84, which may coordinate the operations of the sector controllers 82 and convey commands initiated from outside the FPGA 70. To support this communication, the interconnection resources 46 may act as a network between the device controller 84 and sector controllers 82. The interconnection resources 46 may support a wide variety of signals between the device controller 84 and sector controllers 82. In one example, these signals may be transmitted as communication packets.

The use of configuration memory 76 based on RAM technology as described herein is intended to be only one example. Moreover, configuration memory 76 may be distributed (e.g., as RAM cells) throughout the various programmable logic sectors 74 of the FPGA 70. The configuration memory 76 may provide a corresponding static control output signal that controls the state of an associated programmable element 50 or programmable component of the interconnection resources 46. The output signals of the configuration memory 76 may be applied to the gates of metal-oxide-semiconductor (MOS) transistors that control the states of the programmable elements 50 or programmable components of the interconnection resources 46.

As discussed above, some embodiments of the programmable logic fabric may be configured using indirect configuration techniques. For example, an external host device may communicate configuration data packets to configuration management hardware of the FPGA 70. The data packets may be communicated internally using data paths and specific firmware, which are generally customized for communicating the configuration data packets and may be based on particular host device drivers (e.g., for compatibility). Customization may further be associated with specific device tape outs, often resulting in high costs for the specific tape outs and/or reduced salability of the FPGA 70.

Figure 4:
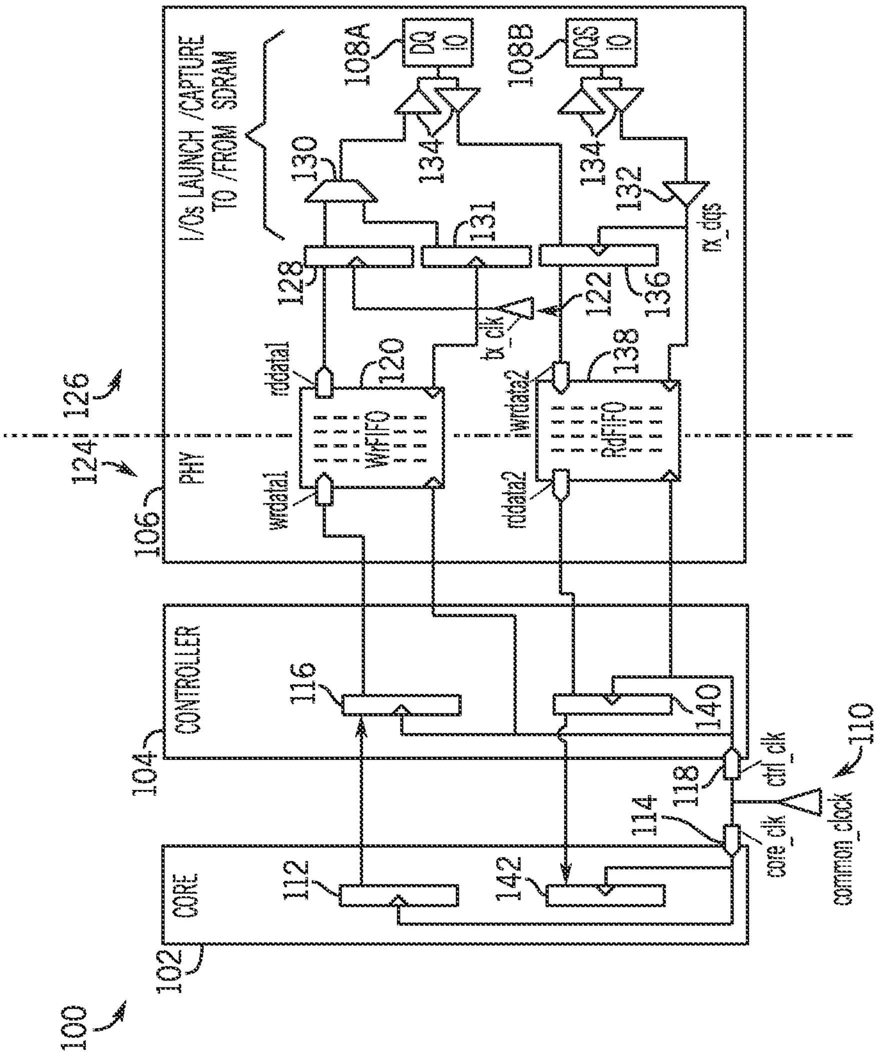
FIG. 4 is a block diagram of a monolithic memory subsystem, in accordance with an embodiment of the present disclosure.

FIG. 4 is a block diagram of a monolithic memory system 100 including a core 102, a memory controller 104, and a PHY 106. The core 102 may be a programmable fabric core, a processor core for a central processing unit (CPU), or a network-on-chip (NOC) endpoint communicating with the memory controller 104. For instance, the core 102 may include a fabric that includes the programmable logic sectors 74. The memory controller 104 may control memory access and may exchange data with the core 102 and the PHY 106. The PHY 106 refers to the physical structure and connections that capture and launch data between itself and the memory controller 104. The memory controller 104 may route one or more timing and/or control signals to a first in, first out (FIFO) memory of the memory subsystem to transfer read and write commands/data. The PHY 106 may include IOs 108 that enable data to be input to the core 102 from the IOs 108 or output from the core 102 to the IOs 108. The IOs 108 may be individually referred to as IOs 108A and 108B. For instance, the IOs 108 may provide an interface to a memory device coupled to the FPGA 70 via the IOs 108. The IO 108A is used for data DQ, and the IO 108B is used for a data strobe (DQS). Note that DQ refers to the JEDEC defined SDRAM data bits and their DQSs used to assist in capturing the transferred data between the memory device and the memory controller 104.

A common clock (common_clock) 110 may be shared between the core 102 and the memory controller 104. The common clock is a root clock (system clock) that controls timing for user logic/designs implemented in the core 102 and for operations in the memory controller 104. The core 102 may use a flip flop 112 to capture data from the core 102 using a common core clock (core_clk) 114 derived from the common clock 110 and to send data to the memory controller 104 from the core 102. The memory controller 104 may then capture the data received from the core 102 using a flip flop 116 using a controller clock (ctrl_clk) 118 derived from the common clock 110 and to transmit write data (wrdata1) to a write FIFO (WrFIFO) 120. The WrFIFO 120 receives wrdata1 into its queue using the controller clock 118.

The WrFIFO 120 also uses a transmit clock 122 (tx_clk) to pop rddata1 from its queue for write operations. Effectively, the WrFIFO 120 is used to transfer data for write operations from a controller clock domain 124 based on the common clock 110 to a IO clock domain 126 based on the transmit clock 122. A flip flop 128 captures the rddata1 coming from the WrFIFO 120 and sends it to a multiplexer 130. The multiplexer 130 may receive the rddata1 and data from the core 102 bypassing the memory controller 104 to enable the memory controller 104 to be bypassed to use the IO 108A as a general-purpose IO (GPIO) when not used to interface with a SDRAM device (not shown). The DQ carrying the rddata1 is transmitted to the SDRAM device via the IO 108A for write operations, and DQS is transmitted to the SDRAM device via the IO 108B for write operations. A flip flop 131 may drive the DQS for write operations based on the transmit clock 122.

In read operations where the SDRAM device drives data through the IO 108A as DQ, the SDRAM device also drives DQS so that the receive clock 132 is received as the DQS from the IO 108B. The DQ and/or DQS may utilize one or more buffers/amplifiers 134 to aid in amplification and/or proper polarization of the DQ and/or the DQS. Data received as DQ via the IO 108A is captured in a flip flop 136 using DQS and transmitted to a read FIFO (RdFIFO) 138 as wrdata2. The RdFIFO 138 pushes the wrdata2 into its queue using DQS and pops data from its queue as rddata2 using the controller clock 118. Effectively, the RdFIFO 138 is used to transfer data for read operations from the IO clock domain 126 based on DQS to the controller clock domain 124 based on the common clock 110.

As illustrated, in the PHY 106 at the IOs 108, the communication to an external SDRAM is source synchronous where the DQS is transmitted alongside the DQ to aid in capturing DQ properly. In source synchronous clocking, the clock travels with the data from a source to a destination. At least partially due to path matching, the clock delay from the source to the destination matches the data delay. The clock tree for the source synchronous clocking may be minimized by providing additional source synchronous clocks. For example, DDR5 uses the source synchronous clock (or a strobe) for every 8 DQ data bits. In contrast, system synchronous clocking (e.g., from core 102 to the controller-side of the PHY 106) has a single large clock tree which may be unmatched to data flop-to-flop paths. As a result, large clock insertion delays may occur between the source and destination clocks in system synchronous clocking. Since the communication between the IOs 108 and the SDRAM device is bi-directional, source synchronous clocking may use an independent clock for a direction of data moving in order for the clock to follow the data in the direction. Thus, the read and write paths may be independent of each other due to the separate clocks (transmit clock 122 and receive clock 132/DQS). Therefore, these separate paths may be used to communicate in a source synchronous manner. The read and write paths may converge to the controller clock domain 124 at the memory controller 104 and the PHY 106 interface. The WrFIFO 120 and RdFIFO 138 may resolve the transition from the controller clock 118 to separate read and write clocking in the IO clock domain 126. However, a conversion in the RdFIFO 138 of the data from the source synchronous clocking to the system synchronous clocking may result in skewed signals between the RdFIFO 138 and a flip flop 140 used to capture rddata2 from the RdFIFO 138. That may cause incorrect data to be latched into the core 102 using a flip flop 142 using the core clock 114.

Figure 5:
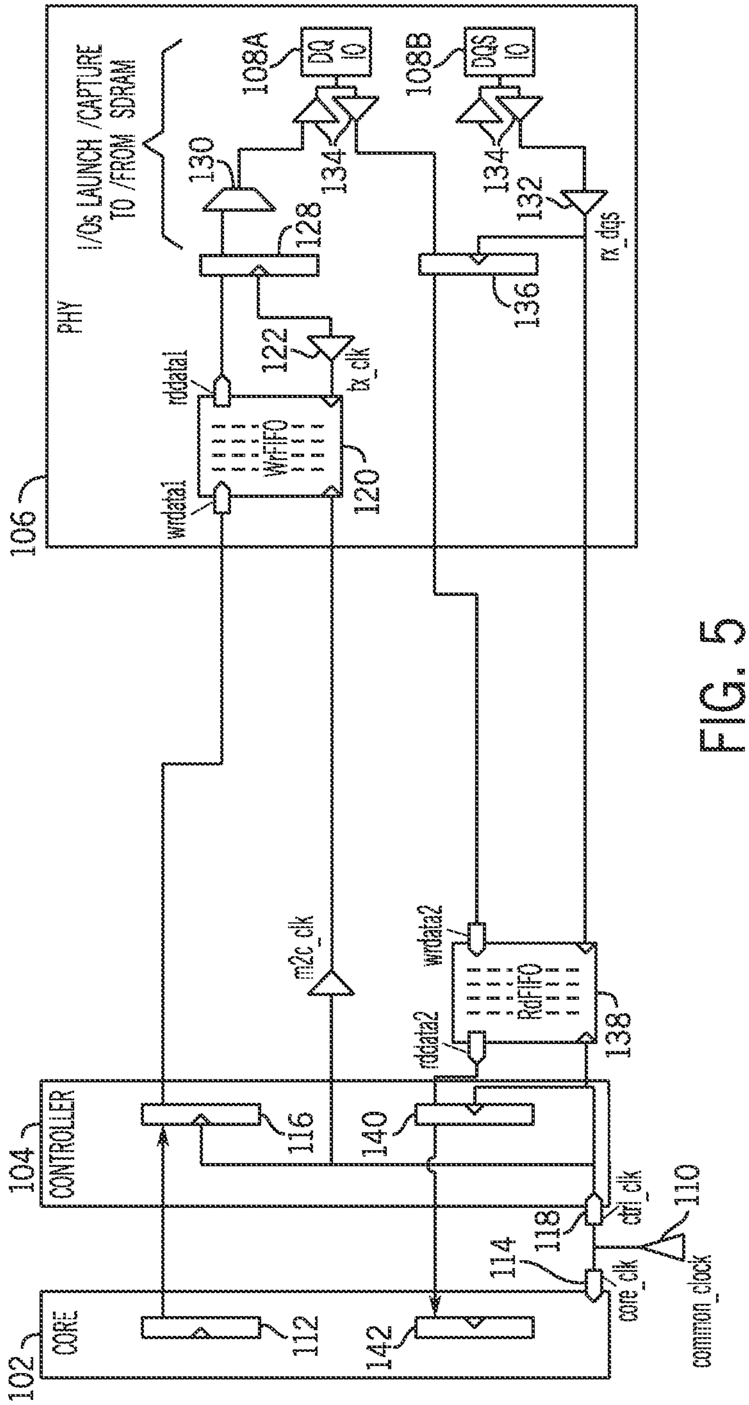
FIG. 5 is a block diagram of monolithic source synchronous communication between a controller and a PHY, in accordance with an embodiment of the present disclosure.

FIG. 5 is a block diagram of source synchronous communication between the memory controller 104 and the PHY 106. As illustrated, the distance between PHY 106 and the memory controller 104 may be relatively long for at least some paths between some of the PHYs 106 of the integrated circuit device 12. Sending system synchronous signals over such long (and diverse between different PHYs 106) may cause timing issues (e.g., skew). To lessen or eliminate this impact, the RdFIFO 138 may be moved from the PHY 106 to in, at, or near the memory controller 104 while the WrFIFO 120 remains in the PHY 106. As a result, data is moved across the relatively large distance between the memory controller 104 and the PHY 106 using source synchronous signals rather than system synchronous signals. As mentioned above, in source synchronous clocking, the clock travels with the data from the source to the destination experiencing many of the same propagation delays. The SDRAM interfaces at the PHY 106 and IO 108 are already source synchronous. Thus, the movement of the RdFIFO 138 to the memory controller 104 may change the source synchronous communication boundary to the memory controller 104. Additionally, source synchronous signals may attain a higher maximum clock frequency (fmax) than system synchronous signals with less clocking issues. Therefore, the wrdata2 and the DQS may travel a greater distance more efficiently without incurring penalty due to the clock traveling with the data in a source synchronous manner.

Figure 6:
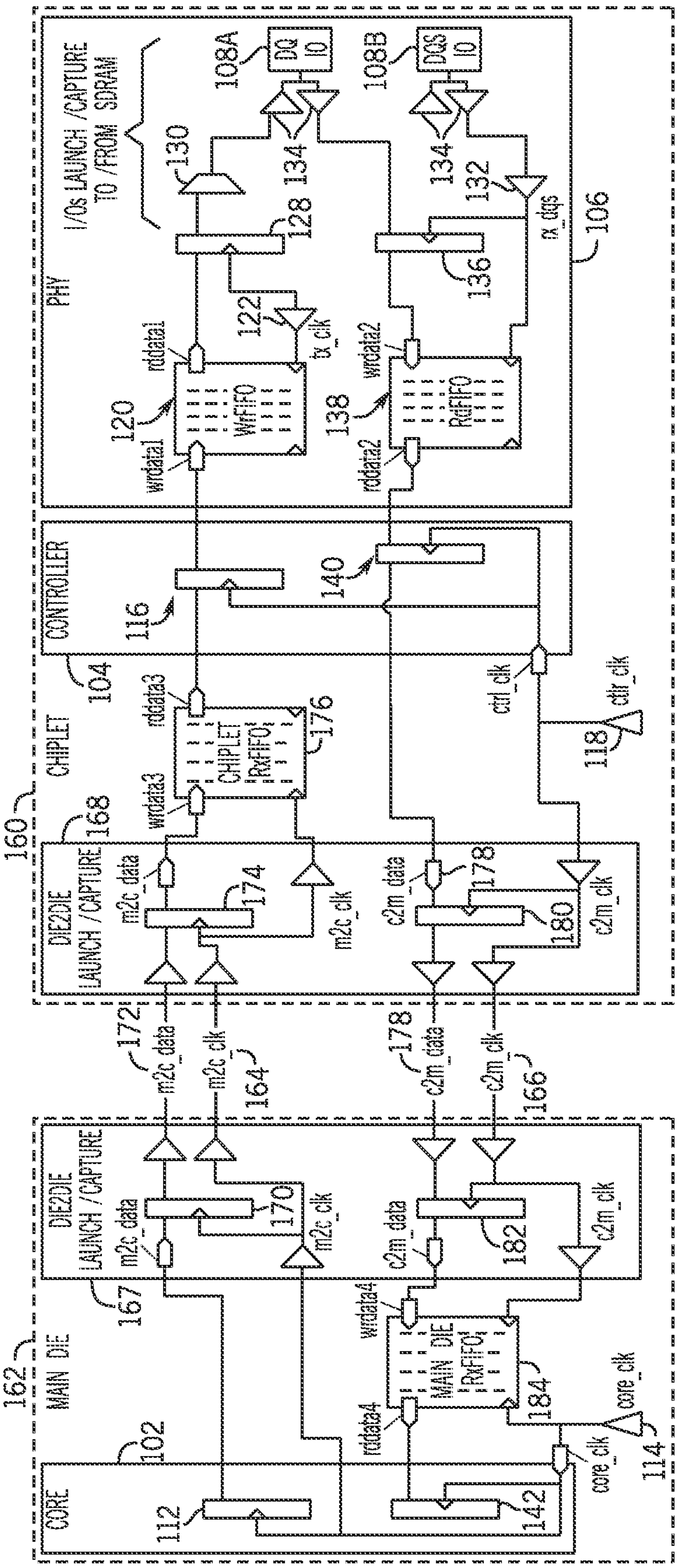
FIG. 6 is a block diagram of a disaggregated memory subsystem, wherein a controller is moved to a chiplet, in accordance with an embodiment of the present disclosure

In disaggregated systems, the foregoing functionality may be split between multiple die/chiplets. FIG. 6 is a block diagram of a disaggregated memory subsystem, wherein the memory controller 104 is moved to a chiplet 160 that also hosts the PHYs 106 for one or more IOs 108. As shown in FIG. 6, a main die 162, and the chiplet 160 may send and receive different respective clock signals across between the main die 162 and the chiplet 160. For instance, a main-to-chiplet clock (m2c_clk) 164 is transmitted from the main die 162 to the chiplet 160, and a chiplet-to-main clock (c2m_clk 166) is transmitted from the chiplet 160 to the main die 162. The m2c_clk 164 may be derived from the core clock 114, and the c2m_clk 166 may be derived from the controller clock 118 (where the controller clock 118 may be independent from the core clock 114). The source synchronous communication between the main die 162 and the chiplet 160 enables the main die 162 and the chiplet 160 to achieve higher fidelity by using separate clocks when sending and receiving data across the die-to-die interconnect. The m2c_clk 164 travels with main-to-chiplet data (m2c_data) 172 from the main die 162 to the chiplet 160, and m2c_clk the chiplet-to-main die clock (c2m_clock) 166 travels with the chiplet-to-main die data (c2m_data) 178.

As previously described, the core 102 may use the flip flop 112 to capture data from the core 102 using a common core clock 114 and send data to a die-to-die launch/capture circuitry 167. A flip flop 170 in the die-to-die launch/capture circuitry 167 captures the m2c_data 172 received from the core 102 and sends it across the die-to-die interconnect to a flip flop 174 in a die-to-die launch capture 168. The flip flop 174 may then capture the m2c_data 172 and transmit it as wrdata3 using the m2c_clk 164.

When the m2c-data 172 and the m2c_clk 164 arrive at the chiplet 160, the m2c_data 172 and the m2c_clk 164 may have a mesochronous relationship to the controller clock 118 on the chiplet 160. A frequency of the m2c_clk 164 may match the frequency of the controller clock 118, but the relative phase may be unknown. As such, the insertion of a chiplet RxFIFO 176 may be used to re-align a phase of the m2c_clk 164 to the phase of the controller clock 118. The chiplet RxFIFO 176 pushes wrdata3 into its queue using the m2c_clk 164. The chiplet RxFIFO 176 uses the m2c_clk 164 to pop rddata3 from its queue for write operations. Thus, there may be a reliable sampling of the m2c_data 172 into the memory controller 104. However, additional area, power, and latency may be used. It should be noted that the memory controller 104 and PHY 106 may function as described above in FIG. 4.

The c2m_data 178 may be sent from the memory controller 104 and captured by a flip flop 180. The flip flop 180 may then send the c2m_data 178 across to the die-to-die launch/capture 167 to a flip flop 182. The flip flop 182 may then capture the c2m_data 178 and transmit wrdata4 using the c2m_clk 166. When the c2m_data 178 and the c2m_clk 166 arrive at the main die 162, they have a mesochronous relationship to (i.e., same frequency but unknown phase relationship with) the core clock 114 of the main die 162. As such, the insertion of a main die RxFIFO 184 may be used to re-align the c2m_data 178 to the core clock 114 for the reliable sampling of m2c_data 172 into the core 102. Similarly, the chiplet 160 may deploy a chiplet RxFIFO 176 for the same purpose for communications from the main die to the chiplet 160.

Alternatively, existing solutions may incorporate delay locked loops (DLLs) to phase align the clocks across the interconnect. The DLL may aid in reducing latency but may use additional power, area, and be more complex. The additional complexity may be attributed to the step of training and locking the DLL and maintaining the lock as voltage and temperature undergo variations. Further, the resulting phase alignment between the clocks may have a phase error, which may directly impact the maximum clock frequency of the clock that is crossing. Thus, the bandwidth performance of the memory controller 104 may be impacted. Additionally, the DLL may not be used for the m2c_clk 164 to the controller clock 118 alignment simultaneously as the c2m_clk 166 and the c2m_data 178. Indeed, positive feedback may be caused by one DLL chasing the other DLL, and neither would lock as a result of all the clocks sharing the same source.

As illustrated, FIG. 6 includes a die-to-die interconnect using the source synchronous clocking. The source synchronous interconnect contains more than one m2c_clk 164 and may be dictated by the maximum ratio of data lines/buses to a source synchronous clock allowed before the max data rate of the interconnect may be comprised due to a wide data skew. For example, in some embodiments, the source synchronous clock may be used for every 16-32 wires to cross 2-4 millimeters of a distance across the interconnect. Further, the multiple m2c_clks 164 may be mesochronous and if a single m2c_clk 164 sources the controller clock 118, then the multiple m2c_clks 164 and the m2c_data 172 may be mesochronous with the controller clock 118 and may use the chiplet RxFIFO 176.

Figure 7:
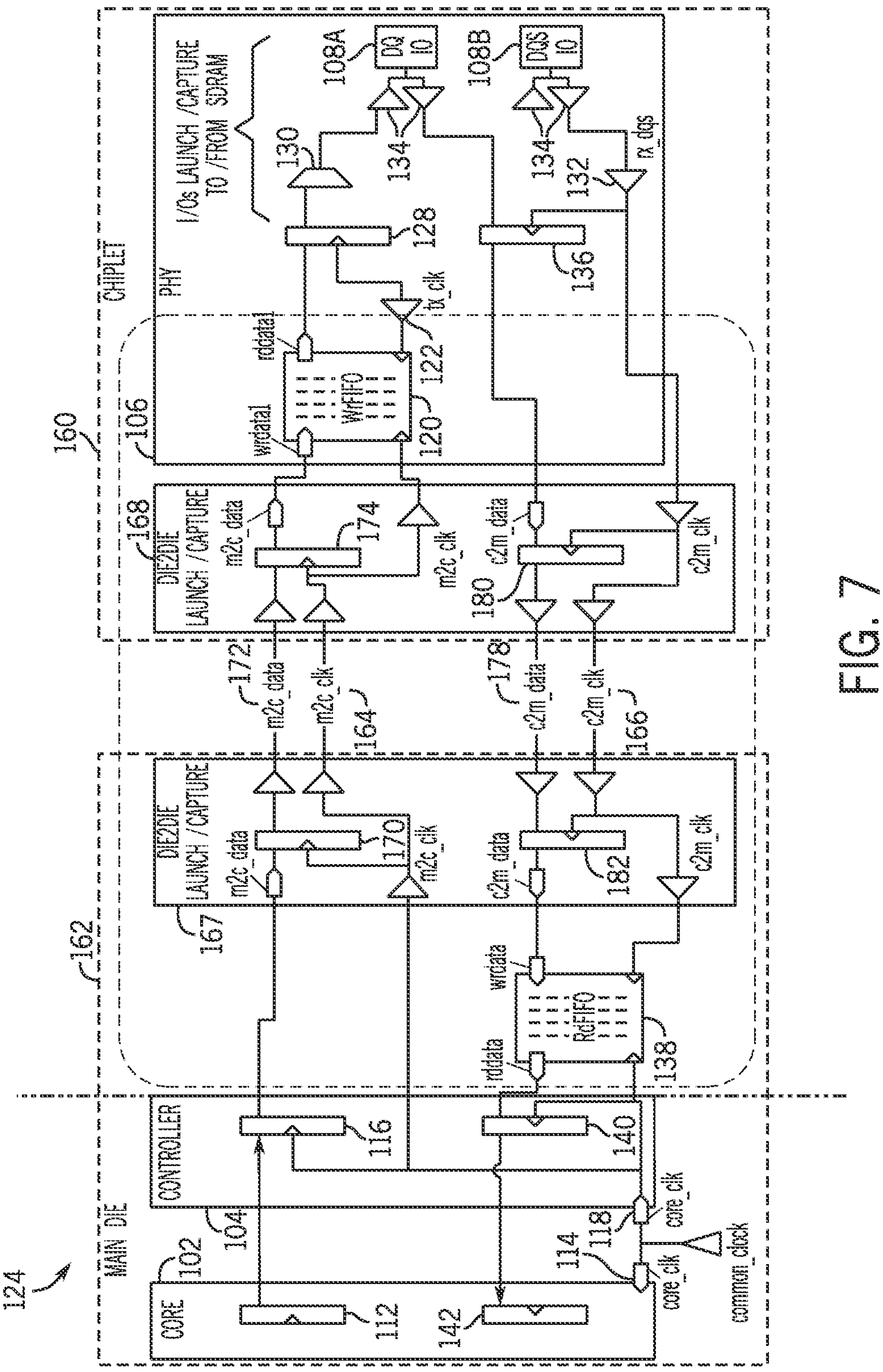
FIG. 7 is a block diagram of a source synchronous controller on a main die in communication with a disaggregated PHY and IOs on a chiplet, in accordance with an embodiment of the present disclosure.

Disaggregated die-to-die interfaces may use source synchronous signaling because source signaling may attain the higher maximum clock frequency and has a power advantage. Examples may include universal chiplet interconnect express (UCIe), and advanced interconnect bus (AIB) standards. Since the memory controller 104 already uses a FIFO (e.g., PHY RdFIFO 138) and has source synchronous signals like those used across the interconnect, the source synchronous nature of the communications between the chiplet 160 and SDRAM may also be repurposed for communication between the chiplet 160 and the main die 162 by moving the memory controller 104 (and its respective FIFO) to the main die 162. FIG. 7 is a block diagram of a source synchronous memory controller 104 on the main die 162 in communication with a disaggregated PHY 106 and IOs 108 on the chiplet 160. As illustrated, the die-to-die cut point is set between the memory controller 104 and the PHY 106, which may allow for use of transmit and receive paths in the PHY 106 that are mesochronous and independent. Additionally, as shown in FIG. 5, the RdFIFO 138 is moved from the PHY 106 to the memory controller 104, while the WrFIFO 120 remains in the PHY 106. Therefore, the RdFIFO 138 may be used to transfer data for read operations from a domain of the c2m_clk 166 to a domain of the core clock 114. Further, the RdFIFO 138 may be used to convert the source synchronous signal to system synchronous. Thus, the die-to-die cut point may allow for the use of pre-existing circuitry to re-align to the controller clock 118 and data and may use less FIFOs than the embodiment shown in FIG. 6. Furthermore, the communication between the memory controller 104 and the PHY 106 may be source synchronous, so that the data and the clock may travel a greater distance more efficiently without the extra FIFOs. Further, setting the memory controller 104 on the main die 162 may enable the memory controller 104 to use a faster node technology on the main die 162 where the core 102 is also set while the chiplet 160 may use a slower/older technology compared to the main die 162. Therefore, the performance of the memory controller 104 may be improved. Moreover, the area overhead of AIB or UCIe solutions may be reduced because the common mesochronous FIFOs originally in the PHY 106 in FIG. 1 may be merged into a singular die-to-die solution.

Figure 8:
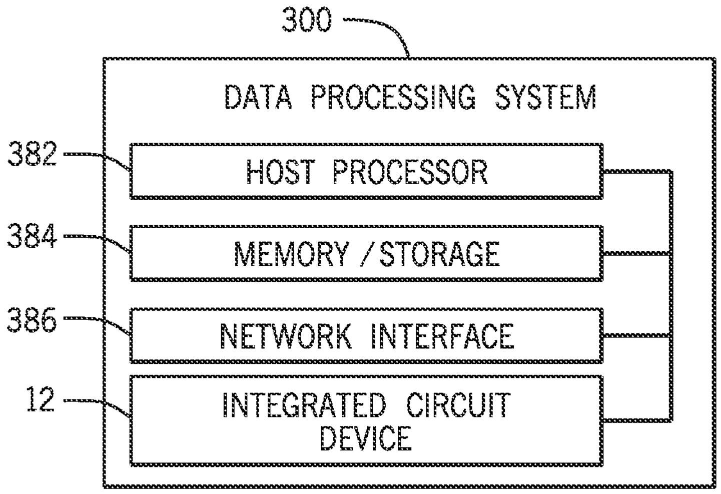
FIG. 8 is a block diagram of a data processing system, in accordance with an embodiment of the present disclosure.

Furthermore, the integrated circuit device 12 may generally be a data processing system or a component, such as an FPGA, included in a data processing system 300. For example, the integrated circuit device 12 may be a component of a data processing system 300 shown in FIG. 8. The data processing system 300 may include a host processor 382 (e.g., CPU), memory and/or storage circuitry 384, and a network interface 386. The data processing system 300 may include more or fewer components (e.g., electronic display, user interface structures, application specific integrated circuits (ASICs)). The host processor 382 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 300 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 384 may include random access memory (RAM), read-only memory (ROM), one or more hard drives, flash memory, or the like. The memory and/or storage circuitry 384 may hold data to be processed by the data processing system 300. In some cases, the memory and/or storage circuitry 384 may also store configuration programs (bitstreams) for programming the integrated circuit device 12. The network interface 386 may allow the data processing system 300 to communicate with other electronic devices. The data processing system 300 may include several different packages or may be contained within a single package on a single package substrate.

In one example, the data processing system 300 may be part of a data center that processes a variety of different requests. For instance, the data processing system 300 may receive a data processing request via the network interface 386 to perform acceleration, debugging, error detection, data analysis, encryption, decryption, machine learning, video processing, voice recognition, image recognition, data compression, database search ranking, bioinformatics, network security pattern identification, spatial navigation, digital signal processing, or some other specialized tasks.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

EXAMPLE EMBODIMENT 1. A system, comprising: programmable logic fabric; a memory controller communicatively coupled to the programmable logic fabric; a physical layer and IO circuit coupled to the programmable logic fabric via the memory controller; and a FIFO to receive read data from a memory device coupled to the physical layer and IO circuit, wherein the FIFO is closer to the memory controller than to the physical layer and IO circuit.

EXAMPLE EMBODIMENT 2. The system of example embodiment 1, wherein the physical layer and IO circuit comprises an additional FIFO used to convert write data from a clock domain of the memory controller to a transmit clock domain of the physical layer and IO circuit.

EXAMPLE EMBODIMENT 3. The system of example embodiment 1, wherein there are no FIFOs in the physical layer and IO circuit between an IO of the physical layer and IO circuit and the FIFO for read data along a read path from the IO.

EXAMPLE EMBODIMENT 4. The system of example embodiment 1, wherein the FIFO is to receive source synchronous data from physical layer and IO circuit.

EXAMPLE EMBODIMENT 5. The system of example embodiment 4, wherein the source synchronous data uses a data strobe (DQS) from the memory device.

EXAMPLE EMBODIMENT 6. The system of example embodiment 4, wherein the FIFO is to output data to the memory controller as system synchronous data.

EXAMPLE EMBODIMENT 7. The system of example embodiment 6, wherein the system synchronous data is based on clock that is common to the programmable logic fabric and the memory controller.

EXAMPLE EMBODIMENT 8. The system of example embodiment 1, comprising: a main die that comprises the programmable logic fabric, the memory controller, and the FIFO; and a chiplet coupled to the main die and comprising the physical layer and IO circuit.

EXAMPLE EMBODIMENT 9. The system of example embodiment 8, wherein is no FIFO on the chiplet between an IO of the physical layer and IO circuit and the main die for read data from the memory device coupled to the IO.

EXAMPLE EMBODIMENT 10. The system of example embodiment 8, wherein the read data from the memory device coupled to an IO of the physical layer and IO circuit is source synchronous through the chiplet to the FIFO of the main die.

EXAMPLE EMBODIMENT 11. The system of example embodiment 8, the chiplet comprises an additional FIFO for write data received as source synchronous data from the memory controller to be sent to the memory device.

EXAMPLE EMBODIMENT 12. A system, comprising: core processing circuitry; a memory controller communicatively coupled to the core processing circuitry; an IO circuit coupled to the core processing circuitry via the memory controller; and a FIFO to receive data from a memory device coupled to the IO circuit, wherein the FIFO is within the memory controller or closer to the memory controller than to the IO circuit.

EXAMPLE EMBODIMENT 13. The system of example embodiment 12 wherein the core processing circuitry comprises a programmable fabric core.

EXAMPLE EMBODIMENT 14. The system of example embodiment 12 wherein the core processing circuitry comprises a processor core.

EXAMPLE EMBODIMENT 15. The system of example embodiment 12, comprising: a main die that comprises the core processing circuitry, the memory controller, and the FIFO; and a chiplet coupled to the main die and comprising the IO circuit including a IO.

EXAMPLE EMBODIMENT 16. The system of example embodiment 15, wherein is no FIFO on the chiplet between the IO and the main die for data from the memory device coupled to the IO.

EXAMPLE EMBODIMENT 17. The system of example embodiment 15, wherein the main die comprises a more advanced technology node than the chiplet.

EXAMPLE EMBODIMENT 18. A method of operating an integrated circuit device, comprising: driving data from a processing core to a memory controller as system synchronous data; driving the data from the memory controller to an IO of IO circuitry as source synchronous data; transmitting the data from the IO to a memory device; receiving incoming data at a FIFO from the memory device via the IO circuitry as incoming source synchronous data, wherein the FIFO is closer to the memory controller than the IO; and outputting the incoming data from the FIFO to the memory controller as incoming system synchronous data.

EXAMPLE EMBODIMENT 19. The method of example embodiment 18, wherein the system synchronous data and the incoming system synchronous data utilize a clock common to the processing core and the memory controller.

EXAMPLE EMBODIMENT 20. The method of example embodiment 18, wherein driving the data from the memory controller to the IO comprises driving the data from a main die comprising the processing core, the memory controller, and the FIFO across an interconnect to a chiplet comprising the IO circuitry, and receiving the incoming data at the FIFO comprises receiving the data from the IO circuitry across the interconnect, and the incoming source synchronous data is driven using a data strobe (DQS) from the memory device.

What is claimed is:

1. A system, comprising:

a main die comprising:

programmable logic fabric;

a memory controller communicatively coupled to the programmable logic fabric; and a first in first out (FIFO) to receive read data from a memory device coupled to a physical layer and an IO circuit, wherein the FIFO is closer to the memory controller than to the physical layer and the IO circuit; and a chiplet coupled to the main die comprising:

the physical layer and the IO circuit coupled to the programmable logic fabric via the memory controller.

2. The system of claim 1, wherein the physical layer and the IO circuit comprises an additional FIFO used to convert write data from a clock domain of the memory controller to a transmit clock domain of the physical layer and the IO circuit.

3. The system of claim 1, wherein there are no FIFOs in the physical layer and the IO circuit between an IO of the physical layer and the IO circuit and the FIFO for the read data along a read path from the IO.

4. The system of claim 1, wherein the FIFO is to receive source synchronous data from the physical layer and the IO circuit.

5. The system of claim 4, wherein the source synchronous data uses a data strobe (DQS) from the memory device.

6. The system of claim 4, wherein the FIFO is to output data to the memory controller as system synchronous data.

7. The system of claim 6, wherein the system synchronous data is based on clock that is common to the programmable logic fabric and the memory controller.

8. The system of claim 1, wherein is no FIFO on the chiplet between an IO of the physical layer and the IO circuit and the main die for the read data from the memory device coupled to the IO.

9. The system of claim 1, wherein the read data from the memory device coupled to an IO of the physical layer and the IO circuit is source synchronous through the chiplet to the FIFO of the main die.

10. The system of claim 1, the chiplet comprises an additional FIFO for write data received as source synchronous data from the memory controller to be sent to the memory device.

11. The system of claim 1, wherein the FIFO is configurable to convert source synchronous data to system synchronous data.

12. The system of claim 1, wherein the memory controller is configurable to output source synchronous data to the physical layer.

13. A system, comprising:

a main die comprising:

core processing circuitry;

a memory controller communicatively coupled to the core processing circuitry; and a first in first out (FIFO) to receive data from a memory device coupled to an IO circuit, wherein the FIFO is within the memory controller or closer to the memory controller than to the IO circuit; and a chiplet coupled to the main die comprising:

the IO circuit coupled to the core processing circuitry via the memory controller.

14. The system of claim 13, wherein the core processing circuitry comprises a programmable fabric core.

15. The system of claim 13, wherein the core processing circuitry comprises a processor core.

16. The system of claim 13, wherein is no FIFO on the chiplet between the IO circuit and the main die for the data from the memory device coupled to the IO circuit.

17. The system of claim 13, wherein the main die comprises a more advanced technology node than the chiplet.

18. A method of operating an integrated circuit device, comprising:

driving data from a processing core to a memory controller as system synchronous data;

driving the data from the memory controller on a main die comprising the memory controller, the processing core, and a first in first out (FIFO) across an interconnect to an IO of IO circuitry on a chiplet as source synchronous data;

transmitting the data from the IO to a memory device;

receiving incoming data at the FIFO from the memory device via the IO circuitry as incoming source synchronous data, wherein the FIFO is closer to the memory controller than the IO; and outputting the incoming data from the FIFO to the memory controller as incoming system synchronous data.

19. The method of claim 18, wherein the system synchronous data and the incoming system synchronous data utilize a clock common to the processing core and the memory controller.

20. The method of claim 18, wherein receiving the incoming data at the FIFO comprises receiving the data from the IO circuitry across the interconnect, and the incoming system synchronous data is driven using a data strobe (DQS) from the memory device.

* * * * *